(12) United States Patent
Judd et al.

(10) Patent No.: US 6,650,456 B2
(45) Date of Patent: Nov. 18, 2003

(54) ULTRA-HIGH FREQUENCY INTERCONNECTION USING MICROMACHINED SUBSTRATES

(75) Inventors: Frank F. Judd, Fogelsville, PA (US); Yongqiang Shi, Diamond Bar, CA (US)

(73) Assignee: TriQuint Technology Holding Co., Hillsboro, OR (US)

( * ) Notice: Subject to any disclaimer, the term of this patent is extended or adjusted under 35 U.S.C. 154(b) by 0 days.

(21) Appl. No.: 10/120,924

(22) Filed: Apr. 11, 2002

(65) Prior Publication Data

US 2003/0193708 A1 Oct. 16, 2003

(51) Int. Cl.[7] .............................. G02F 1/03; G02F 1/07
(52) U.S. Cl. ...................... 359/245; 359/248; 359/256
(58) Field of Search ................................ 359/245, 248, 359/256; 385/11, 14, 16, 24, 44, 49; 257/80, 84; 250/227.24, 227.11

(56) References Cited

U.S. PATENT DOCUMENTS

| | | | | |
|---|---|---|---|---|
| 5,254,237 A | * | 10/1993 | Snaper et al. | 204/298.41 |
| 5,967,834 A | * | 10/1999 | Rugg | 439/499 |
| 6,521,480 B1 | * | 2/2003 | Mitchell et al. | 438/108 |
| 2002/0004320 A1 | * | 1/2002 | Pedersen et al. | 439/66 |
| 2002/0102829 A1 | * | 8/2002 | Williams | 438/597 |
| 2002/0105092 A1 | * | 8/2002 | Coyle | 257/778 |

OTHER PUBLICATIONS

"Electrical Loss Mechamisms in Travelling Wave LiNbO Optical Modulators" by G.K. Gopalakrishnan, W.K. Burns and C.H. Bulmer; Electronics Letters; Jan. 1992; pp. 207–209.

"Microwave Attenuation Reduction Techniques for Wide–Band Ti:LinbO Optical Modulators" by Madabhushi Rangaraj; IEICE Trans. Electron; Aug. 1998; pp. 1321–1327.

"Thin Layer Design of X–Cut LiNbO3 Modulators" by I.L. Gheorma, P. Savi and R.M. Osgood, Jr.; IEEE Photonics Technology Letters; Dec. 2000; pp. 1618–1620.

"A Wide–Band Ti:LinbO Optical Modulator with a Conventional Coplanar Waveguide Type Electrode" by M. Rangaraj; T. Hosoi and M. Kondo; IEEE Photonics Technology Letters; Sep. 1992; 3 pages.

* cited by examiner

Primary Examiner—Ricky Mack
Assistant Examiner—Brandi N Thomas
(74) Attorney, Agent, or Firm—Hitt Gaines, PC

(57) ABSTRACT

The present invention provides a device, a method of making the device, and a system incorporating the same. In one embodiment, the device includes a substrate that has first and second opposing surfaces and first and second thicknesses, wherein the second thickness is less than the first thickness, and the first surface is substantially planar. The device further includes a conductive trace having an input end and an output end and located over the first surface of the substrate, wherein at least one of the input end or output end is aligned with the second substrate thickness.

19 Claims, 4 Drawing Sheets

ULTRA-HIGH FREQUENCY INTERCONNECTION USING MICROMACHINED SUBSTRATES

TECHNICAL FIELD OF THE INVENTION

The present invention is directed, in general, to electronics devices and, more specifically, to an electronics device having a conductive trace aligned with a thinned portion of a substrate, a method of manufacture therefor, and a system including the same.

BACKGROUND OF THE INVENTION

High speed communications continue to present ever-increasing demands for ultra-high frequency electronics. Accordingly, as semiconductor and sub-micron lithography technologies advance, more and more high performance chips have been designed with the intent to meet these demands. Such high performance chips may include ultra-wide bandwidth electro-optic (EO) and electroabsorption (EA) modulators. However, a major bottleneck for large scale commercial production of ultra-high frequency electronic components exists as the ultra-wide bandwidth device packaging technology becomes more and more demanding.

Ultra-wide bandwidth devices employ a planar circuit structure, thereby capitalizing on continued advancements in integrated circuit design and fabrication technology. Integrated circuit dimensions may be on the order of about 0.1 microns to about 10 microns. However, signal sources often arrive at the planar circuit structure via coaxial cable, which may have a diameter between about 0.2 millimeters and about 1 millimeter. The signal source, therefore, requires an electrical connector between the coaxial signal cable and the planar circuit. A coax-to-planar circuit transition is needed to couple the signal to the device circuit. In order to accommodate this transition, bonding pads, circuit bends, and tapered circuit sections are required. However, as the operation bandwidth increases, large coupling loss occurs at certain frequencies due to substrate mode coupling. That is, the input signals couple to the substrate instead of coupling to the desired circuit on the substrate.

Theoretical analysis shows that substrate mode coupling occurs when signal frequency reaches a threshold value. This threshold value is inversely proportional to the substrate thickness. An ultra-wide bandwidth device requires this threshold frequency value to be as high as possible, so that signals having frequencies beneath the threshold value do not couple to the substrate instead of the desired circuit. Therefore, in device design, it is important to push this coupling threshold frequency out of the desired bandwidth of the signal.

Based on the inverse proportionality relationship between the threshold frequency and the substrate thickness, the frequency modes at which signal coupling to the substrate can be eliminated or significantly reduced by decreasing the substrate thickness or by reducing the bonding pads dimensions. For example, an ultra-wide bandwidth lithium niobate modulator requires a substrate thickness less than 0.25 millimeters. However, decreasing substrate thickness or bond pad width has drawbacks in large-scale production. For instance, thin substrates are very difficult to handle and are very fragile, thereby increasing per unit cost and decreasing profitability and component reliability. In addition, small bond pads have large mismatch with coax connectors, demand exacting accuracy and critical tolerances during fabrication and assembly, and increase labor and capital requirements, which also increase costs and decrease profits and component reliability.

Accordingly, what is needed in the art is an electronics device and method of manufacture therefor that avoids the disadvantages associated with the prior art.

SUMMARY OF THE INVENTION

To address the above-discussed deficiencies of the prior art, the present invention provides an electronics device, a method of manufacture therefor, and a system including the same. The electronics device includes a substrate that has first and second opposing surfaces and first and second thicknesses, wherein the second thickness is less than the first thickness. The electronics device further includes a conductive trace having an input end and an output end and located over the first surface of the substrate, wherein at least one of the input end or output end is aligned with the second substrate thickness.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that, in accordance with the standard practice in the industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1A:
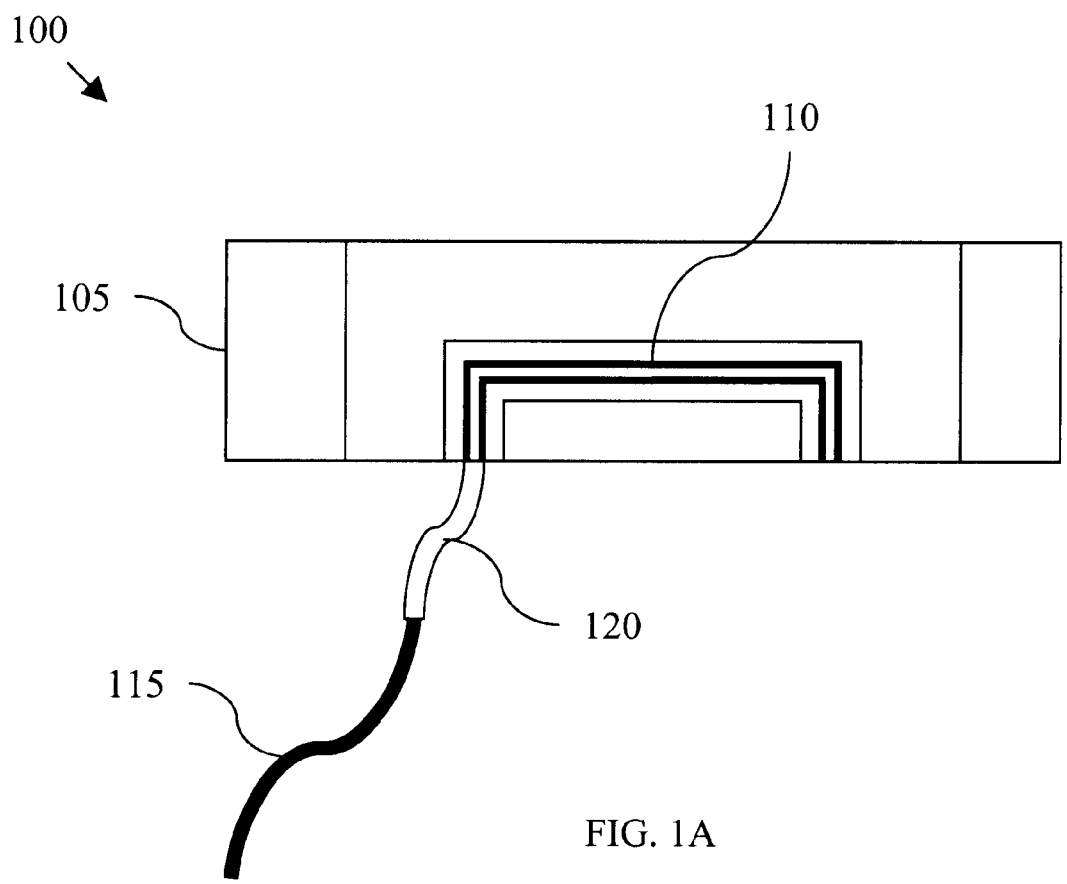
FIGS. 1A and 1B illustrate respective plan and elevation views of an electronics device representative of the prior art.
Figure 1B:
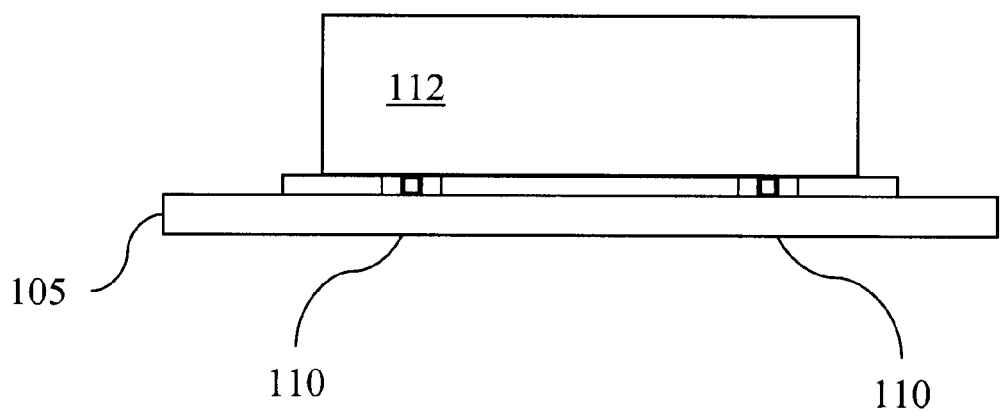

Referring initially to FIGS. 1A and 1B, illustrated are respective plan and elevation views of an electronics device 100 constructed according to the principles of the prior art. The device 100 includes a substrate 105, a conductive trace 110 and an electronics component 112 (the electronics component 112 is removed for clarity in FIG. 1A). An input signal (not shown) is introduced to the device 100 by conventional coaxial cable and ribbon bonds. In the illustrated embodiment, a conventional coaxial cable 115 and ribbon bond 120 are depicted in schematic form. Those skilled in the art understand how an input signal may be conventionally introduced to the device 100, including by means other than coaxial cable 115 and ribbon or wire bond 120. In that regard, the following discussion will focus on the electronics device rather than the delivery of the input signal to the device.

The substrate 105 is relatively thin. Conventional electronics devices have employed a substrate 105 that is relatively thin in order to avoid coupling of the input signal with the substrate 105 instead of the conductive trace 110. Because the substrate 105 is thin, the frequency modes of the substrate 105 are outside of the bandwidth of the input signal, such that the input signal properly couples to the conductive trace 110, and not to the substrate 105. However, as discussed above, the thin substrate 105 provides little structural strength and rigidity, rendering the device 100 fragile and insusceptible to loads encountered during typical handling during manufacture, assembly and shipment. Thus, while the inadvertent coupling of the input signal with the substrate 105 is avoided, the conventional device 100 is undesirable.

Figure 2A:
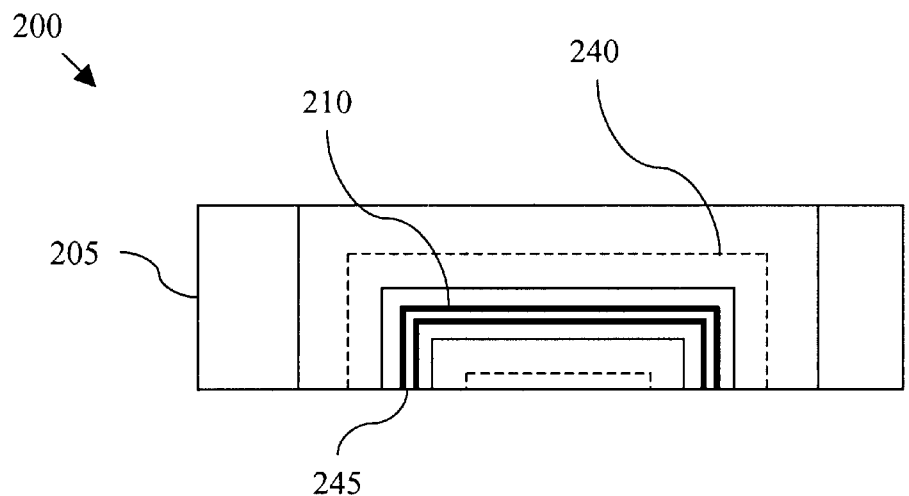
FIGS. 2A and 2B illustrate respective plan and elevation views of one embodiment of an electronics device constructed according to the principles of the present invention.
Figure 2B:
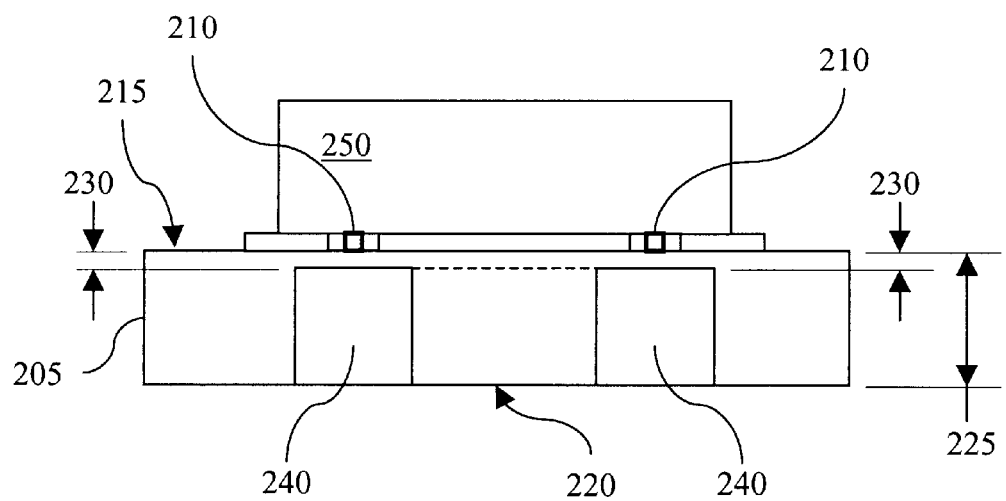

Turning to FIGS. 2A and 2B, illustrated are respective plan and elevation views of one embodiment of an electronics device 200 constructed according to the principles of the present invention. The electronics device 200 includes a substrate 205 and a conductive trace 210 located over the substrate 205. Those having skill in the art understand how the conductive trace 210 may be conventionally formed over the substrate 205.

The substrate 205 has a first surface 215 and second surface 220, the second surface 220 opposing the first surface 215. The substrate 205 also has a first thickness 225 and a second thickness 230, wherein the second thickness 230 is substantially less than the first thickness 225, and the first surface is substantially planar; that is, the surface is planar except for minor surface variations. The first thickness 225 is preferably about 700 microns, although the first thickness 225 may range from about 250 microns to about 1000 microns. In one embodiment, the first thickness 225 may be a standard thickness of a conventional substrate wafer. The second thickness 230 is preferably about 250 microns, although the second thickness 230 may range from about 100 microns to about 350 microns. In the illustrative embodiment shown, the ratio of the first thickness 225 to the second thickness 230 may be about 1.5:1 to about 10:1. However, other ratios are within the scope of the present invention.

In one embodiment, it is intended that the second thickness 230 may be selected so that the highest frequency of an external input signal (not shown) is substantially less than a first resonant frequency of the second thickness 230. For example, a 700 micron thick Z-cut lithium niobate substrate will have a resonant frequency of about 17 Ghz. When the second thickness 230 is 250 microns, the resonant frequency will increase to over 40 GHz. Pushing substrate resonant frequency out of the signal bandwidth will reduce or prevent coupling of the external signal input to the second thickness 230, and the input signal may, thereby, efficiently couple to the intended conductive trace 210.

As shown in the illustrated embodiment, the second thickness 230 may be defined by a trenched portion 240. While the size of the trenched portion 240 may vary from application to application, it is intended that the trenched portion be large enough for the frequencies introduced into the conductive trace 210 by the input signal (not shown) to sufficiently dampen or abate before they reach the portion of the conductive trace 210 adjacent the first thickness 225.

In the illustrated embodiment, the conductive trace 210 is aligned with the second thickness 230 and the trenched portion 240. By aligned, it is intended that the conductive trace 210 is located over the first surface 215 and proximate the second thickness 230. In other embodiments, the trenched portion 240 and the second thickness 230 may be proximate only the input end 245 of the conductive trace 210, the remainder of the conductive trace 210 thereby being aligned with the first thickness 225. Alternative embodiments may include multiple trenched portions 240 defining the second thickness 230.

In one embodiment, the input end 245 of the conductive trace 210 may have a characteristic impedance that is substantially similar or equal to the characteristic impedance of the external circuit (not shown) introducing the input signal to the conductive trace 210. By selecting a conductive trace 210 design that has a characteristic impedance that is at least substantially similar to the characteristic impedance of the conductive trace 210, coupling of the external signal input to the second thickness 230 will be reduced or prevented, and the input signal will more reliably couple to the intended conductive trace 210.

The electronics device 200 may further include an electronics component 250 (e.g., a modulator, laser, diode, transistor, optics device, etc.) coupled to or within the substrate 205 (the electronics component 250 has been removed from FIG. 2A for clarity). For instance, the electronics component 250 may be an optical modulator, wherein the conductive trace 250 may operate as or be in electrical communication with an electrode of the optical modulator. It is intended that the term coupled may include two items coupled directly to and in contact with one another, as well as two items coupled to but not in direct contact with one another. For example, in the embodiment shown in FIG. 2B, the electronics component 250 is coupled to the substrate 205; however, the conductive trace 210 is interposed at least partially therebetween. Nonetheless, in an alternative embodiment, the electronics component 250 may be directly coupled to or fabricated in the substrate 205. The electronics component 250 may be coupled adjacent the conductive trace 210. That is, the electronics component 250 may be coupled over, under or interposing portions of the conductive trace 210. The electronics component 250 may be any component typically employed in RF and microwave devices, including electronic and optoelectronic devices, such as circuit chips, modulators and receivers.

Figure 3A:
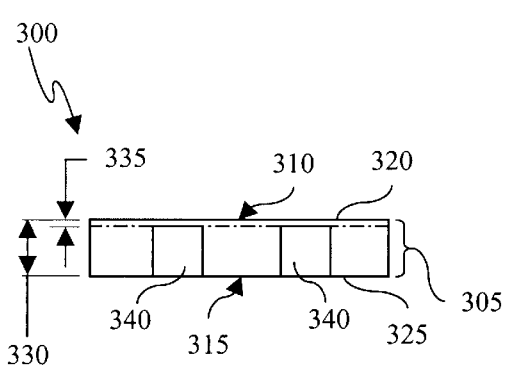
FIGS. 3A and 3B illustrate respective elevation and plan views of another embodiment of an electronics device during an initial stage of manufacture according to the principles of the present invention.
Figure 3B:
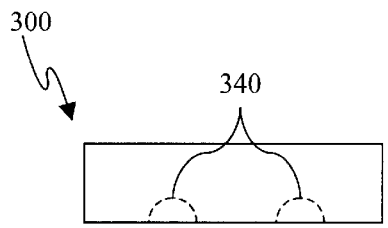

Turning to FIGS. 3A and 3B, illustrated are respective elevation and plan views of an electronics device 300 during an initial stage of manufacture according to the principles of the present invention. The manufacture of the electronics device 300 begins with the provision of a substrate 305 having a first surface 310 and a second surface 315. In the illustrative embodiment shown, the substrate 305 may include a first layer 320 coupled to a second layer 325. The first layer 320 and the second layer 325 may be coupled together mechanically, such as with threaded fasteners or clips, or may be coupled with adhesive or other conventional means known to those skilled in the art. The substrate 305 may comprise semiconductor materials, electro-optic materials, electro-absorptive materials, and other insulating materials, including silicon, indium phosphide, lithium niobate, aluminum oxide, gallium nitride, ceramic, polymeric, composite and glass.

The substrate 305 includes a first thickness 330 and a second thickness 335. The first thickness 330 may formed by proper selection or manufacture of the substrate 305, because the first thickness 330 may be equal to a thickness of the substrate 305. The second thickness 335 may be formed by conventionally etching the substrate 305 to form one or more scalloped portions 340. Those having skill in the art will understand that the scalloped portions 340, and therefore the second thickness 335, may be formed by methods other than or in addition to etching, including but not limited to photolithography, sandblasting, ablating, abrading, and grinding or otherwise machining the substrate 305 to mechanically remove portions thereof. It should be understood that the scalloped portions 340 may be formed in the second layer 325. In such embodiments, the second thickness 335 may be substantially equal to a thickness of the first layer 320.

Figure 4A:
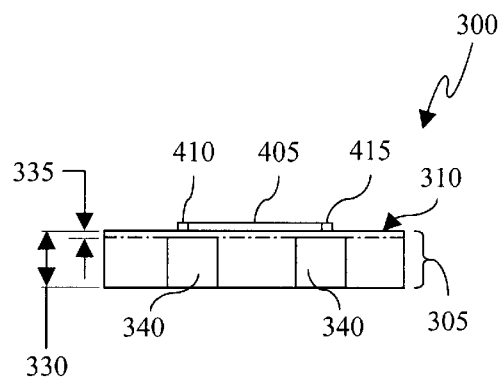
FIGS. 4A and 4B illustrate respective elevation and plan views of the electronics device shown in FIGS. 3A and 3B after the addition of a conductive trace.
Figure 4B:
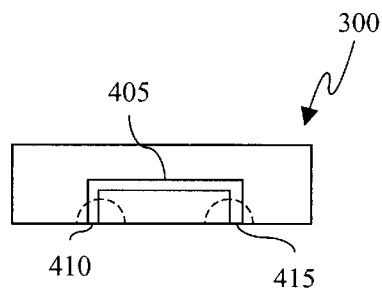

Turning to FIGS. 4A and 4B, illustrated are respective elevation and plan views of the electronics device 300 after a conductive trace 405 has been located over the first surface 310 of the substrate 305. The conductive trace 405 may be conventionally formed over the substrate 305, and may be formed directly on the first surface 310. The conductive trace 405 has at least one input end 410 and one output end 415. In an advantageous embodiment, at least one of the input end 410 or the output end 415 is aligned with the second thickness 335. However, in the illustrated embodiment, both the input end 410 and the output end 415 are shown aligned with the second thickness 335. By aligned, it is intended that either the input end 410 or the output end 415, or both, are located over the first surface 310 proximate the second thickness 335. Thus, it should be understood that the second thickness 335 and the scalloped portions 340 may be formed proximate a substantial portion of the conductive trace 405, similar to that illustrated in FIGS. 2A and 2B.

Figure 5A:
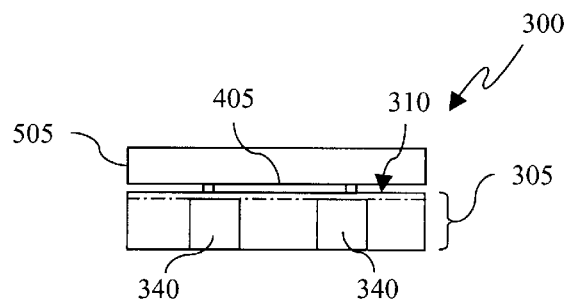
FIGS. 5A and 5B illustrate respective elevation and plan views of the electronics device shown in FIGS. 4A and 4B after the addition of an optical component.
Figure 5B:
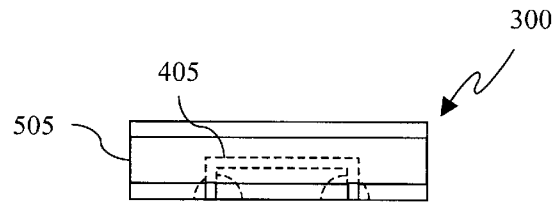

Turning to FIGS. 5A and 5B, illustrated are respective elevation and plan views of electronics device 300 shown in FIGS. 4A and 4B after the addition of an optical component 505. The electronics component 505 may be coupled to the substrate 305 adjacent to the conductive trace 405. As previously discussed, it is intended that the term coupled may include two items coupled directly to and in contact with one another, as well as two items coupled to but not in direct contact with one another. The electronics component 505 may be coupled to the substrate 305 by adhesive, wire bonds, clips, stud bumps or other conventional means. In one embodiment, the electronics component 505 may be directly fabricated in the substrate 305. The electronics component 505 may be any component typically employed in RF and microwave devices, including electronic and optoelectronic devices, such as a modulator.

Figure 6:
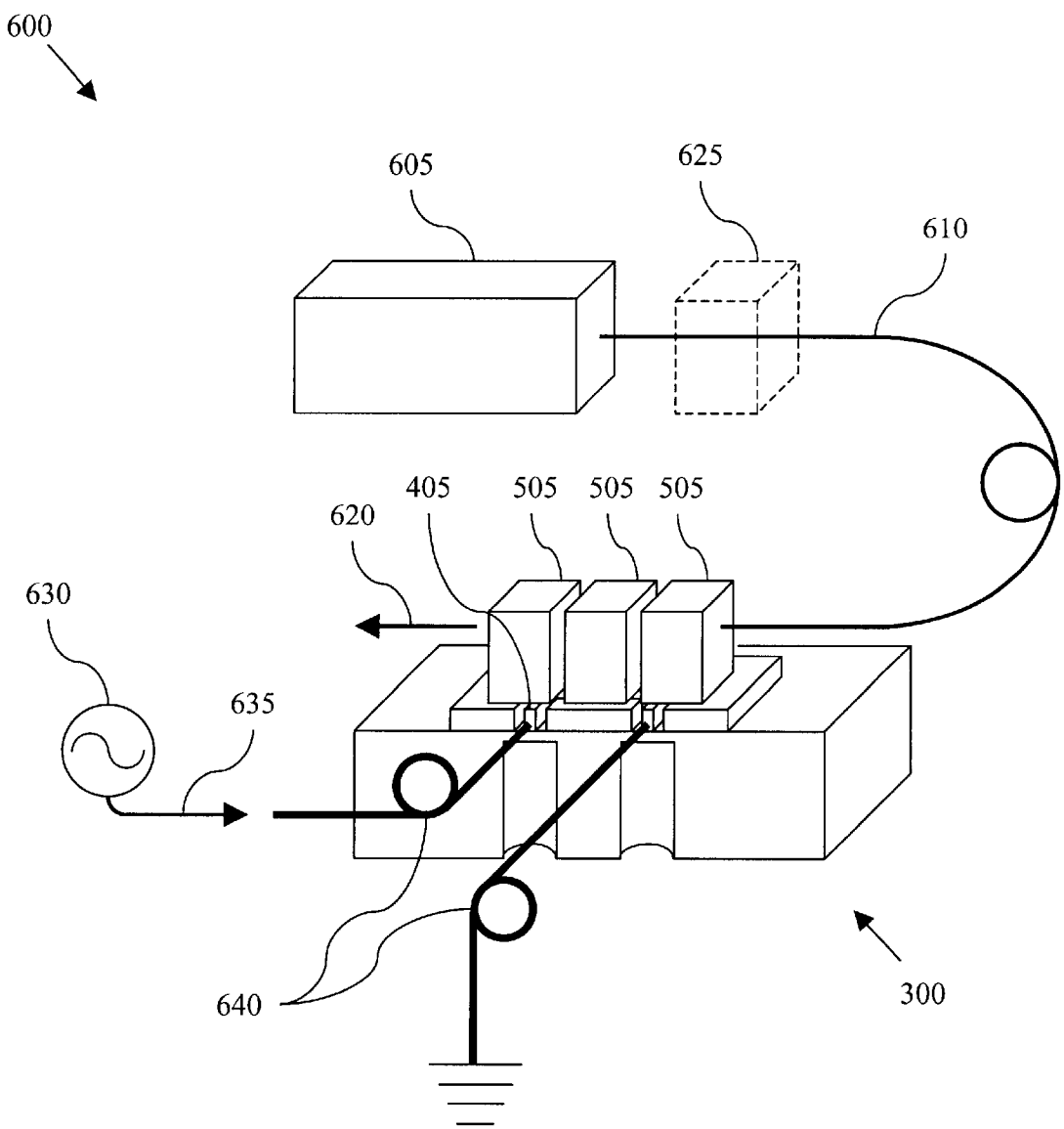
FIG. 6 illustrates a three-dimensional view of an optoelectronics system constructed according to the principles of the present invention.

Turning to FIG. 6, illustrated is a plan view of an optoelectronics system 600, which may form one environment in which an optical system 300 in accordance with the principles of the present invention may be used. In the illustrative embodiment, an optical transmitter 605 sends an optical signal 610 across an optical fiber 615 to an electronics component 505. In one embodiment, the optical transmitter 605 may be a light source, such as a laser, that may generate the optical signal 610. In another embodiment, the optical transmitter 605 may be an optical component which alters an initial optical signal (not shown) directed into the optical transmitter 605 to produce the optical signal 610. The electronics component 505 may be the electronics component 505 of the electronics device 300 shown in FIGS. 5A and 5B (e.g., an optical modulator). In the illustrative embodiment shown, the optical signal 610 may travel through multiple electronics components 505. The modulated optical signal 620 then leaves the electronics component 505. The optoelectronics system 600 may include another optical element 625, such as a laser, diode, modulator, optical amplifier, waveguide, photodetector, or another similar device.

The optoelectronics system may further include an electronic signal generator device 630, which may send an electronic signal 635 through external circuit 640, to the conductive trace 405 of the electronics device 300, and then to ground. In one embodiment, the conductive trace 405 may not terminate to ground, as shown, but may terminate at another location. Those having skill in the art will understand that the external circuit 640 may comprise coaxial cable, ribbon bonds and other conventional connection means. Those having skill in the art will further understand that the electronics device 300 employed in the optoelectronics system 600 may include multiple conductive traces 405 for use in cooperation with the multiple electronics components 505. The electronic signal 635 may amplify or otherwise modulate the optical signal 605 passing through the electronics component 505.

Although the present invention has been described in detail, those skilled in the art should understand that they can make various changes, substitutions and alterations herein without departing from the spirit and scope of the invention.

What is claimed is:

1. An electronics device, comprising:
   a substrate having first and second opposing surfaces and first and second thicknesses wherein the second thickness is substantially less than the first thickness and the first surface is substantially planar; and
   a conductive trace having an input end and an output end and located over the first surface and wherein at least one of the input end or output end is aligned with the second thickness and wherein the highest frequency of an external signal input is substantially less than a first resonant frequency of the second thickness.

2. The electronics device as recited in claim 1 further including a modulator coupled to the substrate.

3. The electronics device as recited in claim 2 wherein said electronics device forms a portion of an optoelectronics system wherein the modulator is coupled to the substrate and the optoelectronics systems further includes an electrical signal input cable optically coupled to the electronics device.

4. The electronics device as recited in claim 1, wherein the input end and the output end are aligned with the second thickness.

5. The electronics device as recited in claim 1 wherein the input end has a characteristic impedance substantially similar to a characteristic impedance of an external circuit introducing an input signal to the input end.

6. The electronics device as recited in claim 1 wherein a ratio of the first thickness to the second thickness is about 1.5:1 to about 10:1.

7. The electronics device as recited in claim 1 wherein a substantial portion of the conductive trace is aligned with the second thickness.

8. A method of manufacturing an electronics device, comprising:
   providing a substrate having first and second opposing surfaces and first and second thicknesses wherein the second thickness is less than the first thickness and the first surface is substantially planar; and locating a conductive trace over the first surface, the conducive trace having an input end and an output end, wherein at least one of the input end or output end is aligned with the second thickness and wherein the highest frequency of an external signal input is substantially less than a first resonant frequency of the second thickness.

9. The method as recited in claim 8 wherein providing includes etching the substrate to form the second thickness.

10. The method as recited in claim 8 wherein providing includes mechanically removing a portion of the substrate to form the second thickness.

11. The method as recited in claim 8 wherein providing includes coupling a first layer to a second layer to form the first thickness, and wherein the second layer forms the second thickness.

12. The method as recited in claim 8 wherein providing includes providing a substrate comprising one selected from the group consisting of:

silicon;

indium phosphide;

lithium niobate;

aluminum oxide;

gallium nitride;

ceramic;

polymeric;

composite; and glass.

13. The method as recited in claim 8 further comprising coupling a modulator to the substrate.

14. The method as recited in claim 8 wherein a substantial portion of the conductive trace is aligned with the second thickness.

15. An optoelectronics system, comprising:

an electrical signal input; and an optoelectronics device, including:

a substrate having first and second opposing surfaces and first and second thicknesses wherein the second thickness is less than the first thickness and the first surface is substantially planar; and a conductive trace having an input end connected to the electrical signal input cable and an output end and located over the first surface and wherein at least one of the input end and output end is aligned with the second thickness and wherein the highest frequency of an external signal input is substantially less than a first resonant frequency of the second thickness; and an optical signal modulator coupled to the substrate and adjacent the conductive trace.

16. The optoelectronics system as recited in claim 15 wherein the input end has a characteristic impedance substantially similar to a characteristic impedance of the electrical signal input cable.

17. The optoelectronics system as recited in claim 15 further comprising a plurality of electrical components coupled to the substrate, each of the plurality of electrical components located adjacent a trace having an input end located over the first surface and aligned with the second thickness.

18. The optoelectronics system as recited in claim 15 wherein a substantial portion of the conductive trace is aligned with the second thickness.

19. The optoelectronics system as recited in claim 15 wherein the first thickness includes a first layer and second layer coupled together, wherein the second thickness is the second layer.

* * * * *